United States Patent
Lee et al.

(10) Patent No.: US 12,169,759 B2
(45) Date of Patent: Dec. 17, 2024

(54) QUANTUM INFORMATION PROCESSING DEVICE

(71) Applicant: Hitachi, Ltd., Tokyo (JP)

(72) Inventors: Noriyuki Lee, Tokyo (JP); Ryuta Tsuchiya, Tokyo (JP); Digh Hisamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 490 days.

(21) Appl. No.: 17/630,266

(22) PCT Filed: Mar. 12, 2020

(86) PCT No.: PCT/JP2020/010935
§ 371 (c)(1),
(2) Date: Jan. 26, 2022

(87) PCT Pub. No.: WO2021/024533
PCT Pub. Date: Feb. 11, 2021

(65) Prior Publication Data
US 2022/0292383 A1    Sep. 15, 2022

(30) Foreign Application Priority Data
Aug. 5, 2019 (JP) ................................ 2019-143442

(51) Int. Cl.
*G06N 10/40* (2022.01)

(52) U.S. Cl.
CPC .................... *G06N 10/40* (2022.01)

(58) Field of Classification Search
CPC . G06N 10/40; H01L 29/423; H01L 29/66977; H01L 29/0673; B82Y 10/00
See application file for complete search history.

(56) References Cited

U.S. PATENT DOCUMENTS

| 10,692,924 | B2 * | 6/2020  | Dzurak         | H10N 60/0912 |
| 11,387,399 | B2 * | 7/2022  | Roberts        | B82Y 10/00   |
| 2007/0063182 | A1 | 3/2007  | Yang et al.    |              |
| 2010/0270534 | A1 | 10/2010 | Pioro-Ladrier et al. | |

(Continued)

FOREIGN PATENT DOCUMENTS

| JP | 2018-532255 A | 11/2018 |
| WO | 2009/072550 A1 | 6/2009 |

(Continued)

OTHER PUBLICATIONS

International Search Report of PCT/JP2020/010935 dated Jun. 16, 2020.

*Primary Examiner* — Nha T Nguyen
(74) *Attorney, Agent, or Firm* — MATTINGLY & MALUR, PC

(57) ABSTRACT

The first layer includes a first gate electrode array disposed in the first direction to control the qubits of the qubit string, and a second gate electrode array disposed in the first direction to control the inter-qubit interaction of the interaction string. The second layer includes a third gate electrode array disposed in the second direction, and a fourth gate electrode array disposed in the second direction adjacently to the third gate electrode array. The third and the fourth gate electrode arrays control a part of the multiple qubits, and a part of the multiple inter-qubit interactions, respectively.

10 Claims, 15 Drawing Sheets

(56) References Cited

U.S. PATENT DOCUMENTS

| | | | |
|---|---|---|---|
| 2013/0221330 A1* | 8/2013 | Choi | H01L 29/66439 |
| | | | 438/151 |
| 2018/0226451 A1 | 8/2018 | Dzurak et al. | |
| 2019/0043973 A1* | 2/2019 | George | H01L 29/66795 |
| 2019/0229189 A1 | 7/2019 | Clarke et al. | |
| 2020/0364600 A1* | 11/2020 | Elsherbini | H10N 60/805 |
| 2024/0222474 A1* | 7/2024 | Niebojewski | G06N 10/40 |

FOREIGN PATENT DOCUMENTS

| | | |
|---|---|---|
| WO | 2018/031007 A1 | 2/2018 |
| WO | 2019/125348 A1 | 6/2019 |

\* cited by examiner

HORIZONTAL DIRECTION

VERTICAL DIRECTION

QUANTUM INFORMATION PROCESSING DEVICE

TECHNICAL FIELD

The present invention relates to a quantum information processing device.

BACKGROUND ART

Currently, aiming at implementation of quantum computers, research has been proceeded by many groups on a global scale. Experiments have been carried out using various physical systems. Whichever the physical system the group employs, it is necessary for implementing the quantum computer to allow the isolated system that never conducts material exchange nor energy exchange with the external environment to generate qubits, and to maintain coherence of the quantum system for an extended period of time.

For the purpose of causing the qubits to serve as the quantum computer, it is essential not only to pursue performance of the single qubit, but also to construct the device that contains multiple qubits.

As one of the reported cases concerning multi-quantum bit integration of the semiconductor qubit (for example, see patent literature 1), there is the single qubit structure which is simply extended in the lateral direction. In the structure, many electrodes are vertically arranged, to which a DC voltage is applied to control the qubit state and the interaction between the qubits.

The number of the electrodes in the foregoing structure, however, increases as the increase in the number of qubits. Upon operation at an extremely low temperature in the refrigerator, the number of electrodes which allow external application of DC voltages and RF pulses is limited. This may restrict the number of the qubits that can be increased.

When qubits are two-dimensionally added planarly to the structure having the qubits linearly arranged one-dimensionally, there is no place for accommodating controlling electrodes. Accordingly, it is impossible to make the structure practicable.

It is therefore difficult to make the qubits into two-dimensional planar array by simply extending the qubit structure through the conventionally proposed process. It has been well known that two-dimensional extension is required to make the qubits serving in the quantum computer. The qubit string structure adapted to the requirement has been proposed (for example, see patent literature 2). It is intended to individually control the two-dimensionally extended qubit strings through switching with the wiring and the transistor, which are formed on the upper layer.

CITATION LIST

Patent Literature

Patent Literature 1: WO Publication No. 2009/072550
Patent Literature 2: Japanese Unexamined Patent Application Publication (Translation of PCT Application) No. 2018-532255

SUMMARY OF INVENTION

Technical Problem

If the qubit having the lower layer with complicated structure is added to the qubit string structure as disclosed in patent literature 2, the resultant structure fails to securely maintain crystallinity in the upper layer of the substrate. Accordingly, it is difficult for the current semiconductor manufacturing method to form the transistor on the upper layer.

It is an object of the present invention to provide the quantum information processing device which allows two-dimensional qubit extension using the current semiconductor manufacturing method.

Solution to Problem

The quantum information processing device according to an embodiment of the present invention includes a fin, a first layer formed on the fin, and a second layer formed on the first layer. The fin includes a qubit string having multiple qubits arranged in a row in a first direction, and an interaction string having multiple inter-qubit interactions arranged in a row in the first direction. The qubit string and the interaction string are alternately arranged in a second direction that is different from the first direction. The first layer includes a first gate electrode array disposed in the first direction to control the qubits of the qubit string, and a second gate electrode array disposed in the first direction to control the inter-qubit interaction of the interaction string. The second layer includes a third gate electrode array disposed in the second direction, and a fourth gate electrode array disposed in the second direction adjacently to the third gate electrode array. The third and the fourth gate electrode arrays control a part of the multiple qubits, and a part of the multiple inter-qubit interactions, respectively.

Advantageous Effects of Invention

An embodiment of the present invention provides the quantum information processing device which allows two-dimensional qubit extension using the current semiconductor manufacturing method.

DESCRIPTION OF EMBODIMENT

Figure 1:
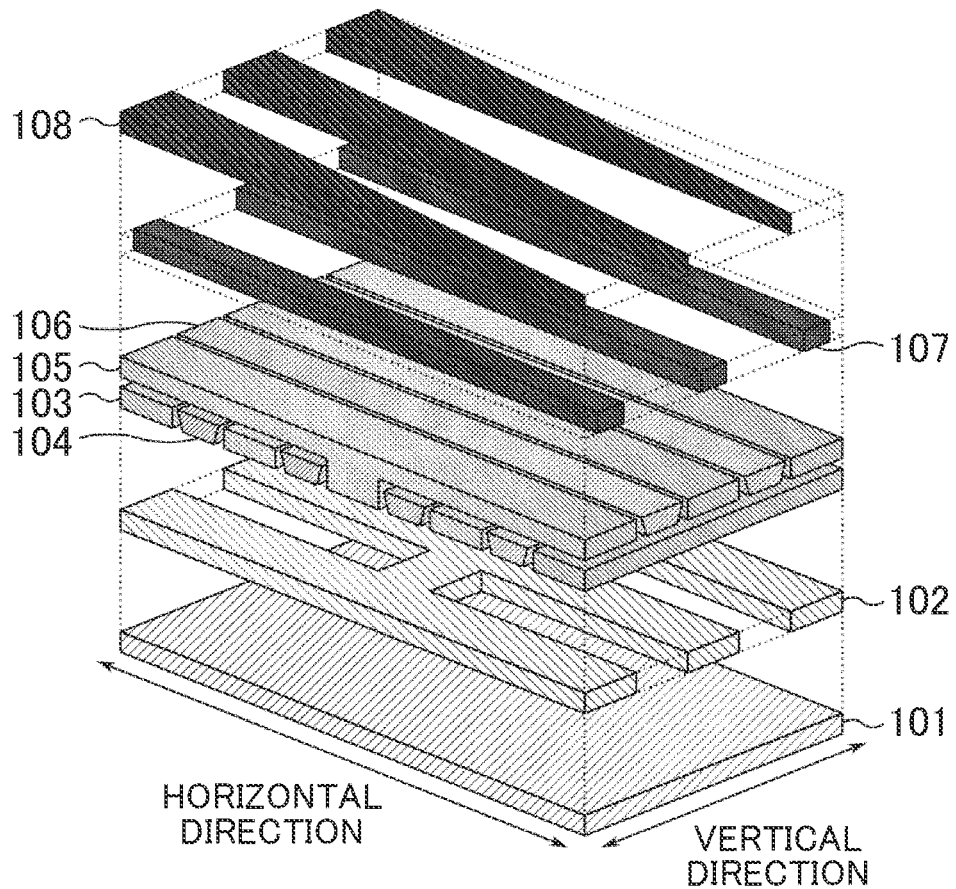
FIG. 1 is a bird's eye view of a qubit string that constitutes the quantum information processing device.

An embodiment of the present invention will be described referring to the drawings.

A structure of a qubit string that constitutes a quantum information processing device will be described.

As FIG. 1 illustrates, the qubit string has a 5-layer structure, including a first layer, a second layer, a third layer, a fourth layer, and a fifth layer from the bottom. Each of those layers is insulated by a layer as an insulator (for example, $SiO_2$).

The first layer is an initialization gate 101 as a semiconductor (for example, p-type Si), which is configured to apply a DC voltage to the entire surface of the second layer from below.

Figure 2:
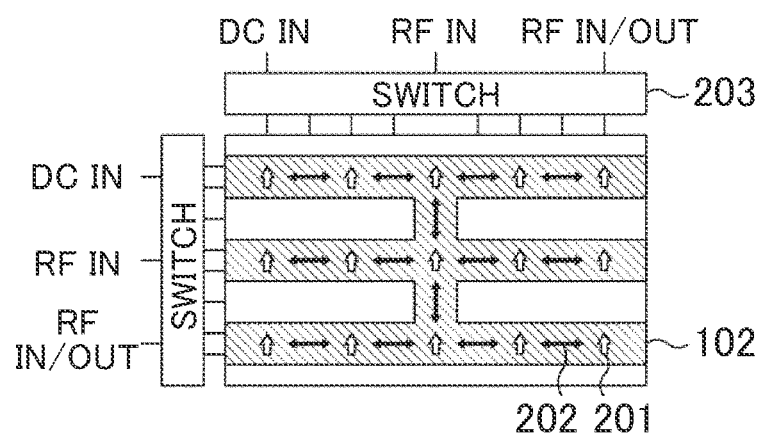
FIG. 2 is a plan view of a quantum information processing device.

The second layer includes a fin 102 as a semiconductor (for example, intrinsic Si). As FIG. 2 illustrates, qubits 201 are formed on the upper surface of the fin 102 in a two-dimensional square grating arrangement. An interaction 202 between the qubits is generated in accordance with the shape of the fin 102. The fin 102 is shaped to allow every interaction among all qubits 201 in the horizontal direction, and the interaction among some of the qubits 201 in the vertical direction.

The third layer is divided into an upper layer and a lower layer, each of which has a gate electrode as a semiconductor (for example, poly-Si). Two types of gate electrodes are provided, specifically, qubit control gates 103, 105, and interaction control gates 104, 106. The lower layer has a linear shape constituted by vertically extending gate electrodes including the qubit control gates 103 and the interaction control gates 104, which are alternately arranged. There is no gate electrode formed on the horizontally extending liner fin 102 of the second layer. The upper layer has a linear shape constituted by horizontally extending gate electrodes including the qubit control gates 105 and the interaction control gates 106, which are alternately arranged. The qubit control gates 105 and the interaction control gates 106 of the upper layers are brought into contact with the fin 102 of the second layer at a part where the gate electrodes of the lower layer are not formed.

The fourth layer has a conduction wire 107 as a conductor (for example, Al), which is formed into a horizontally extending linear shape.

The fifth layer has a magnet 108 as a ferromagnetic body (for example, Co), which extends to be formed into a shape having its size changed in the horizontal direction in order to vary the magnetostatic field to be applied to the qubit 201.

As FIG. 2 illustrates, electrodes are connected to the initialization gate 101, the fin 102, the qubit control gates 103, the interaction control gates 104, the qubit control gates 105, the interaction control gates 106, and the conduction wires 107, which are illustrated in FIG. 1 to allow application of DC voltages and RF pulses, and extraction of the output RF pulse. A switch 203 is provided outside the qubit string for switching input/output signals. Accordingly, the number of externally connected terminals is not increased in proportion to the number of the qubits 201.

The number of qubits 201 may be increased through extension to arbitrary number of rows both in horizontal and vertical directions. For example, FIG. 2 illustrates a total of 15 qubits constituted by 5 rows in the horizontal direction and 3 rows in the vertical direction. It is also possible to provide a total of 60 qubits constituted by 10 rows in the horizontal direction and 6 rows in the vertical direction through repetitive formation of the same structure.

A method of producing the qubit string will be described in sequence.

Figure 4A:
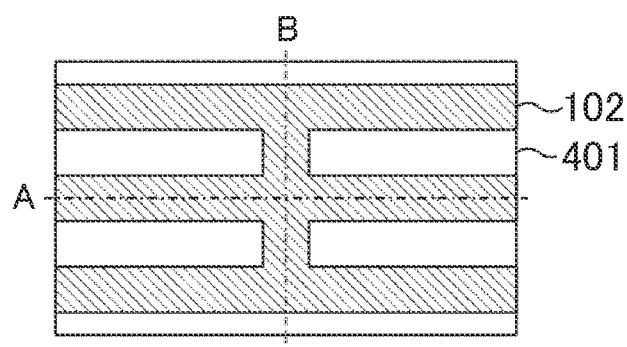
FIG. 4A is a plan view representing a method of manufacturing the qubit strings that constitute the quantum information processing device.
Figure 4B:
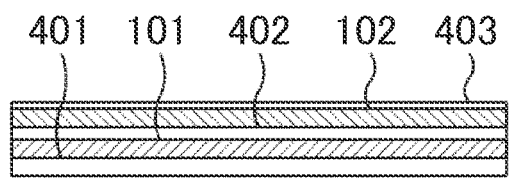
FIG. 4B is a sectional view A representing the method of manufacturing the qubit strings that constitute the quantum information processing device.
Figure 4C:
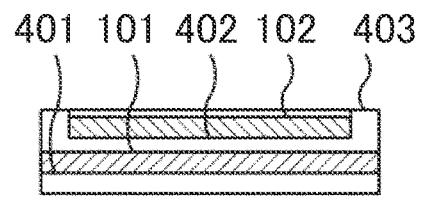
FIG. 4C is a sectional view B representing the method of manufacturing the qubit strings that constitute the quantum information processing device.

Referring to FIGS. 4A, 4B, 4C, the initialization gate 101 as a semiconductor (for example, p-type Si formed through implantation of impurities) over an entire surface of a substrate as a semiconductor (for example, Si-based crystal). The initialization gate 101 is used for initializing the qubit 201. A layer 402 as an insulator (for example, $SiO_2$) is formed on the initialization gate 101. The fin 102 as a semiconductor (for example, Si-based crystal) is formed on the insulator layer 402. The shape of the fin 102 serves to determine coupling relation between the respective qubits in the end. The qubits are linearly coupled in every horizontal row, and coupled in a part of the vertical rows as needed. Finally, a gate insulating film 403 as an insulator (for example, $SiO_2$) is formed so that the fin 102 is insulated from the gate electrode to be generated subsequently.

Figure 5A:
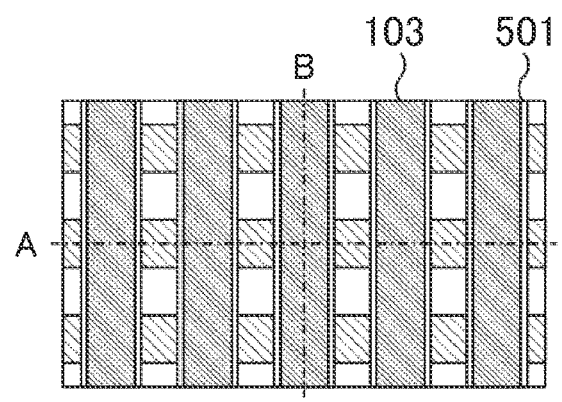
FIG. 5A is a plan view representing the method of manufacturing the qubit strings that constitute the quantum information processing device.
Figure 5B:
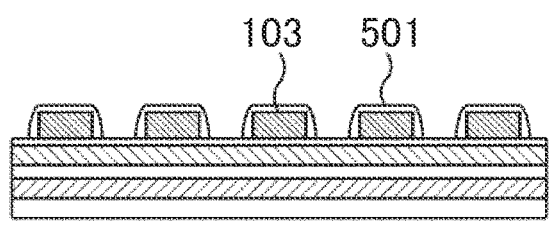
FIG. 5B is a sectional view A representing the method of manufacturing the qubit strings that constitute the quantum information processing device.
Figure 5C:
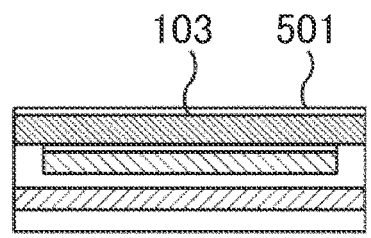
FIG. 5C is a sectional view B representing the method of manufacturing the qubit strings that constitute the quantum information processing device.

As FIGS. 5A, 5B, 5C illustrate, the qubit control gates 103 each as a semiconductor (for example, poly-Si) are formed on the fin 102. The qubit control gate 103 is formed into a vertically extending linear shape. As a result, on the horizontally extending linear fin 102, the qubit control gates 103 are discretely joined to confine the single electron so as to serve as the qubit 201. The qubit control gate 103 is provided with a spacer 501 as an insulator (for example, $Si_3N_4$) for insulation from the gate electrode to be formed subsequently.

Figure 6A:
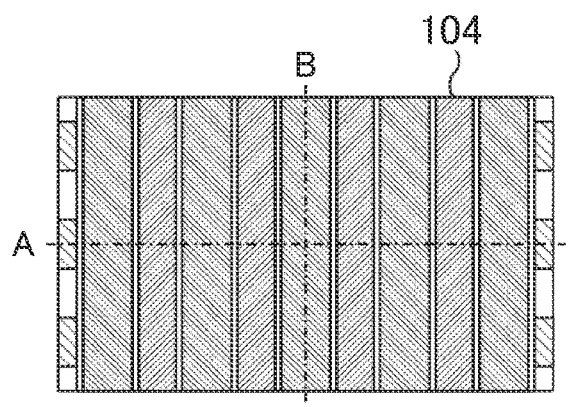
FIG. 6A is a plan view representing a method of manufacturing the qubit strings that constitute the quantum information processing device.
Figure 6B:
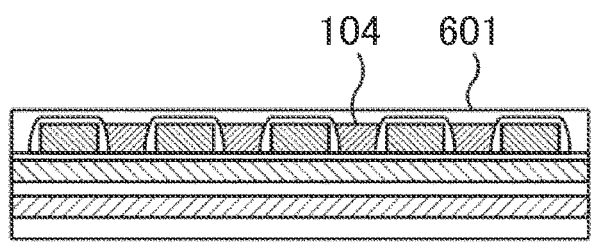
FIG. 6B is a sectional view A representing the method of manufacturing the qubit strings that constitute the quantum information processing device.
Figure 6C:
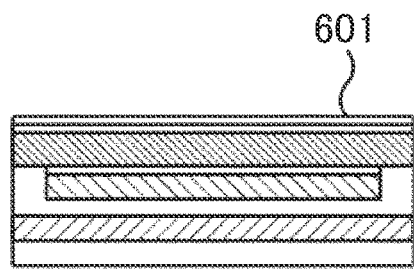
FIG. 6C is a sectional view B representing the method of manufacturing the qubit strings that constitute the quantum information processing device.

As FIGS. 6A, 6B, 6C illustrate, the interaction control gate 104 as a semiconductor (for example, poly-Si) is formed between the qubit control gates 103 to have a vertically extending linear shape like the qubit control gate 103. As a result, on the horizontally extending linear fin 102, the interaction control gates 104 are discretely joined to control the interaction 202 between the qubits 201 in parallel arrangement. A layer 601 as an insulator (for example, $SiO_2$) is formed to execute planarization.

Figure 7A:
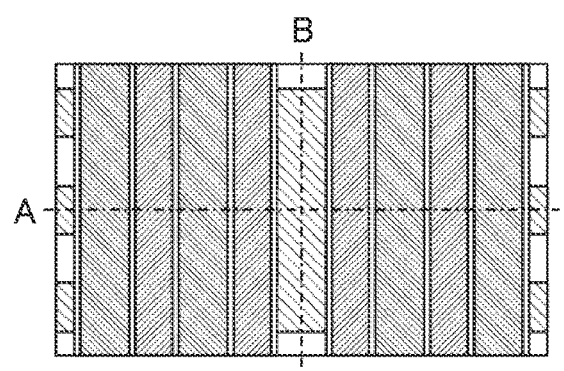
FIG. 7A is a plan view representing the method of manufacturing the qubit strings that constitute the quantum information processing device.
Figure 7B:
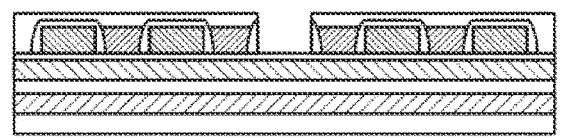
FIG. 7B is a sectional view A representing the method of manufacturing the qubit strings that constitute the quantum information processing device.
Figure 7C:
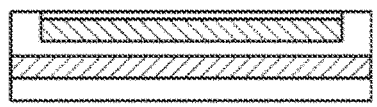
FIG. 7C is a sectional view B representing the method of manufacturing the qubit strings that constitute the quantum information processing device.

Referring to FIGS. 7A, 7B, 7C, as the gates are not discretely formed on the vertically extending linear fin 102, the qubit control gate 103 is removed by executing the mask processing and the etch-back processing. An etching condition is adjusted to stop execution of the etch-back processing on the gate insulating film 403. The gate insulating film 403 on the fin 102 is exposed again.

Figure 8A:
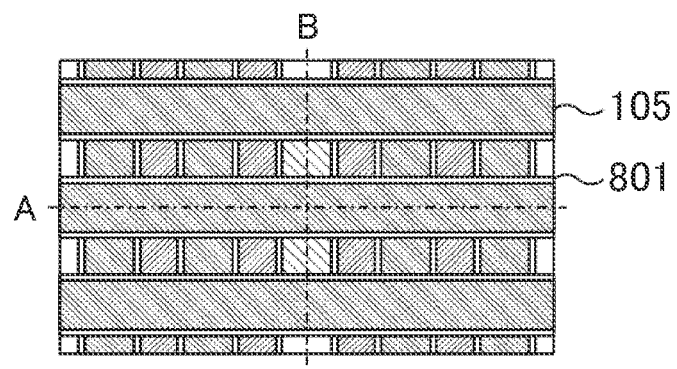
FIG. 8A is a plan view representing the method of manufacturing the qubit strings that constitute the quantum information processing device.
Figure 8B:
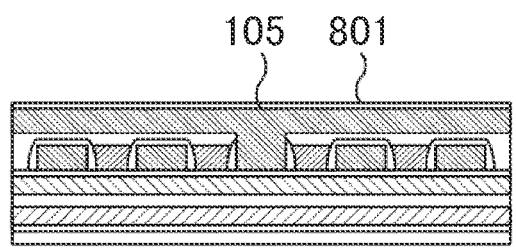
FIG. 8B is a sectional view A representing the method of manufacturing the qubit strings that constitute the quantum information processing device.
Figure 8C:
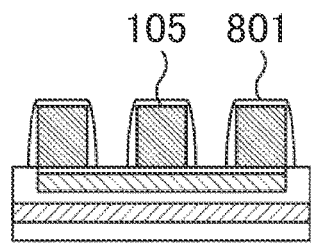
FIG. 8C is a sectional view B representing the method of manufacturing the qubit strings that constitute the quantum information processing device.

Referring to FIGS. 8A, 8B, 8C, the qubit control gates 105 each as a semiconductor (for example, poly-Si) are formed on the vertically extending linear fin 102. Unlike the qubit control gate 103, it is formed into the horizontally extending linear shape. In the processing, the qubit control gates 105 are discretely formed on the vertically extending linear fin 102 while being joined therewith discretely to confine the single electron so as to serve as the qubit 201. The spacer 501 insulates the qubit control gate 105 from the qubit control gates 103 and the interaction control gates 104. The qubit control gate 105 is provided with a spacer 801 as an insulator (for example, $Si_3N_4$) for insulation from the gate electrode to be formed subsequently.

Figure 9A:
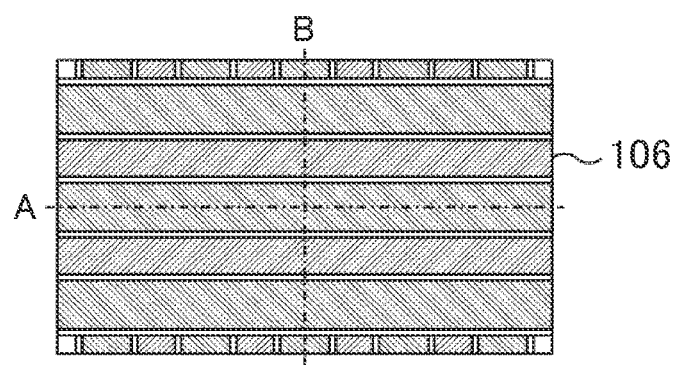
FIG. 9A is a plan view representing the method of manufacturing the qubit strings that constitute the quantum information processing device.
Figure 9B:
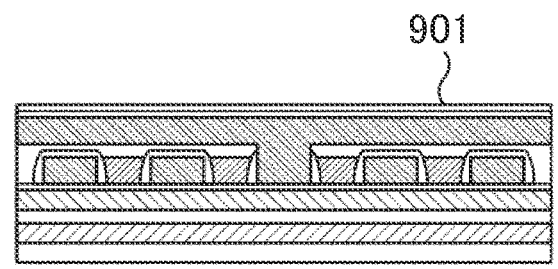
FIG. 9B is a sectional view A representing the method of manufacturing the qubit strings that constitute the quantum information processing device.
Figure 9C:
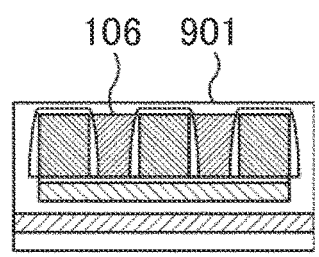
FIG. 9C is a sectional view B representing the method of manufacturing the qubit strings that constitute the quantum information processing device.

Referring to FIGS. 9A, 9B, 9C, the interaction control gate 106 as a semiconductor (for example, poly-Si) is formed between the qubit control gates 105 to have a horizontally extending linear shape like the qubit control gate 104. As a result, the interaction control gates 106 are discretely formed on the vertically extending linear fin 102 while being joined therewith. This allows control of the interaction 202 between the qubits 201 in vertical arrangement. A layer 901 as an insulator (for example, $SiO_2$) is formed to execute planarization.

Figure 10A:
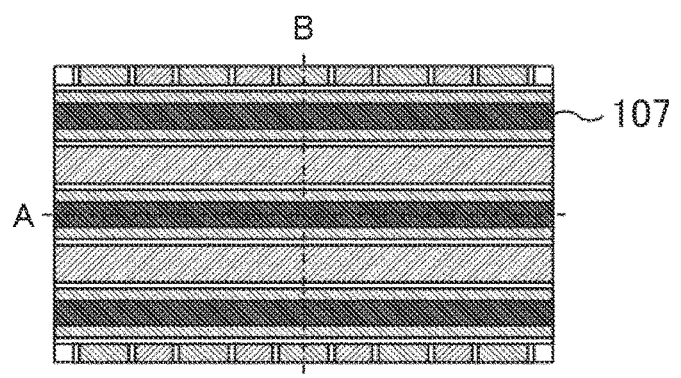
FIG. 10A is a plan view representing the method of manufacturing the qubit strings that constitute the quantum information processing device.
Figure 10B:
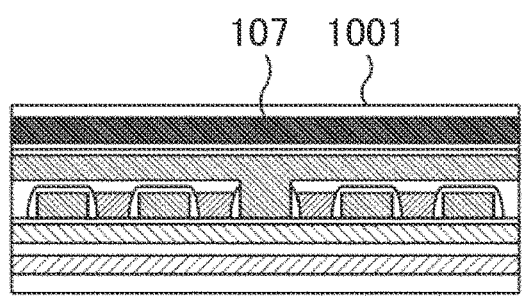
FIG. 10B is a sectional view A representing the method of manufacturing the qubit strings that constitute the quantum information processing device.
Figure 10C:
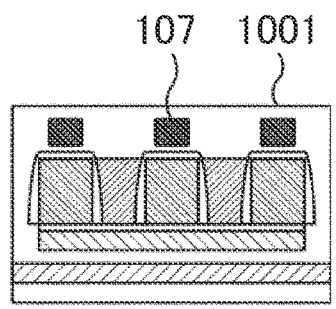
FIG. 10C is a sectional view B representing the method of manufacturing the qubit strings that constitute the quantum information processing device.

Referring to FIGS. 10A, 10B, 10C, the conduction wires 107 each as a conductor (for example, Al) are formed on the qubit control gates 105 and the interaction control gates 106 to have a horizontally extending linear shape like the qubit control gates 103 and the interaction control gates 104. This makes it possible to apply the RF pulse to the qubit 201. The RF pulses each having the same pulse time width at the same frequency are applied to the qubits 201 arranged in the horizontal direction. Thereafter, a layer 1001 as an insulator (for example, $SiO_2$) is formed to execute planarization.

Figure 11A:
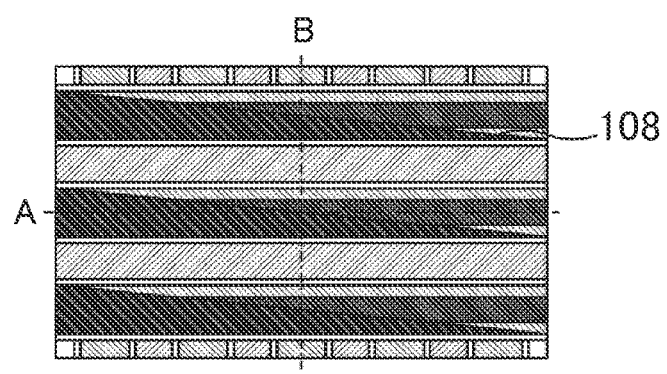
FIG. 11A is a plan view representing the method of manufacturing the qubit strings that constitute the quantum information processing device.
Figure 11B:
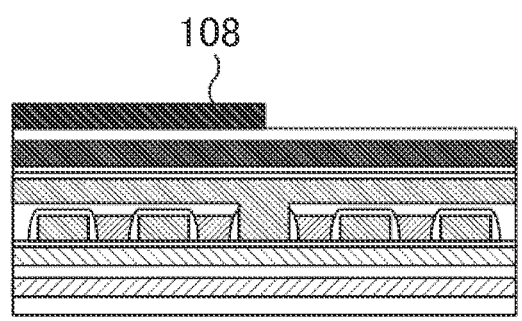
FIG. 11B is a sectional view A representing the method of manufacturing the qubit strings that constitute the quantum information processing device.
Figure 11C:
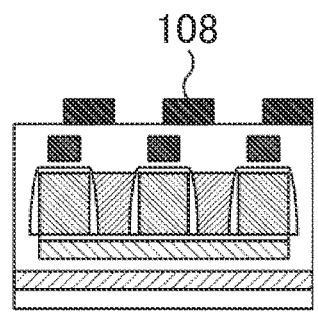
FIG. 11C is a sectional view B representing the method of manufacturing the qubit strings that constitute the quantum information processing device.

Referring to FIGS. 11A, 11B, 11C, the magnets 108 each as the ferromagnetic body (for example, Co) are formed on the conduction wires 107 for magnetization. It is formed into a horizontally extending shape with variable width or thickness so that a different magnetostatic field is applied to each of the horizontally arranged qubits 201. The foregoing method allows production of the qubit string as illustrated in FIG. 1.

The quantum information processing device of the embodiment includes the fin 102, the first layer formed on the fin 102, and the second layer formed on the first layer as illustrated in FIG. 1.

As FIG. 2 illustrates, the fin 102 includes the qubit string having multiple qubits arranged in a row in a first direction (for example, vertical direction), and the interaction string having multiple inter-qubit interactions arranged in a row in the first direction (for example, vertical direction). The qubit string and the interaction string are alternately arranged in the second direction (for example, horizontal direction) that is different from the first direction (for example, vertical direction).

As FIG. 1 illustrates, the first layer includes a first gate electrode array (qubit control gate 103) disposed in the first direction (for example, vertical direction) to control the qubits of the qubit string, and a second gate electrode array (interaction control gate 104) disposed in the first direction (for example, vertical direction) to control the inter-qubit interaction of the interaction string.

As FIG. 1 illustrates, the second layer includes a third gate electrode array (qubit control gate 105) disposed in the second direction (for example, horizontal direction), and a fourth gate electrode array (interaction control gate 106) disposed in the second direction (for example, horizontal direction) adjacently to the third gate electrode array (qubit control gate 105).

The third gate electrode arrays (qubit control gates 105) and the fourth gate electrode arrays (interaction control gates 106) control a part of the multiple qubits and a part of the multiple inter-qubit interactions, respectively (see FIG. 2).

The second layer has a part of the third gate electrode arrays (qubit control gates 105) and a part of the fourth gate electrode arrays (interaction control gates 106) each extending as an electrode array in the first direction (for example, vertical direction) (see FIG. 8B). The electrode array controls the part of the qubits and the part of the inter-qubit interactions, respectively (see FIG. 2).

Figure 3:
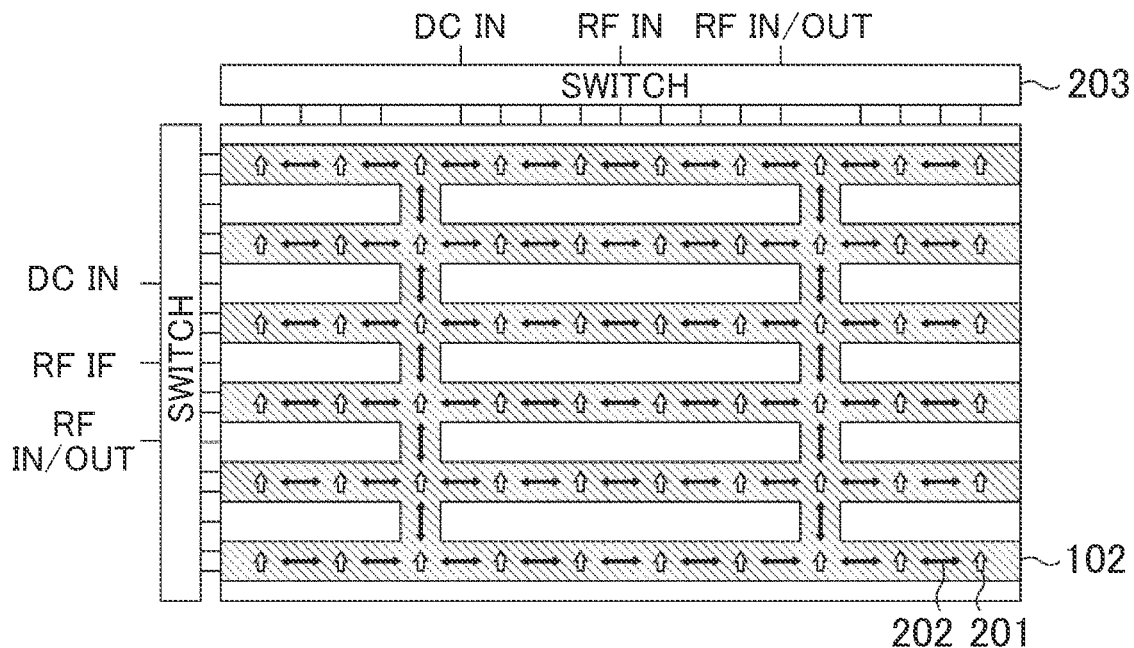
FIG. 3 is a plan view of a quantum information processing device.

As FIGS. 2 and 3 illustrate, the electrode arrays are discretely disposed in the second direction (for example, horizontal direction) to two-dimensionally extend the number of qubits.

As FIG. 8B illustrates, the electrode array forms a protruding portion which is in contact with the fin 102. The protruding portion is in contact with the fin 102 at a part where the first and the second gate electrode arrays (qubit control gate 103, interaction control gate 104) of the first layer are not formed.

The embodiment allows the quantum information processing device to make the qubits two-dimensionally extensible through the currently employed semiconductor manufacturing method.

Examples will be described referring to the drawings.

First Example

A first example describes a method of initializing the qubit strings of the quantum information processing device.

Figure 12:
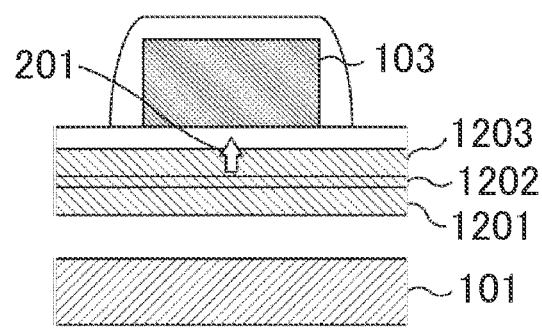
FIG. 12 is a detailed sectional view of a fin of the qubit that constitutes the quantum information processing device.

As FIG. 12 illustrates, in order to allow initialization of the qubit 201, the fin 102 is structured to have three layers including a first layer 1201 as an n-type semiconductor (for example, n-type Si), a second layer 1202 as an insulator, and a third layer 1203 as a semiconductor (for example, intrinsic Si) from the bottom. The first layer 1201 serves as an electron reservoir.

Figure 13:
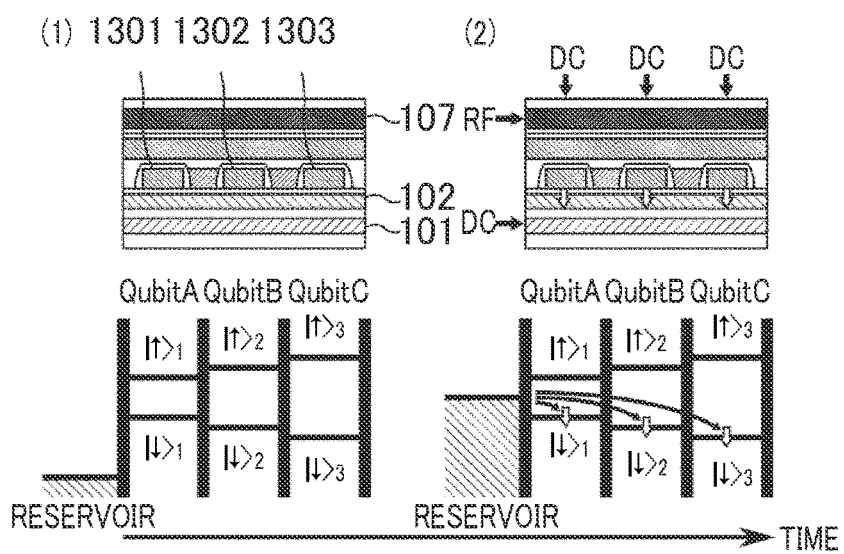
FIG. 13 is a sectional view of the qubit strings for explaining a method of initializing the qubit strings that constitute the quantum information processing device, and the electron energy level.

FIG. 13 illustrates three horizontally arranged qubits 201, which are extracted from the qubit string to indicate change in an electron condition upon initialization. It is assumed that the qubits 201 generated below the qubit control gates 1301, 1302, 1303 shown in the sectional view of the qubit string in the upper section of FIG. 13 are designated as qubits A, B, and C, respectively. In this case, the qubits A, B, C are all initialized.

The lower section of FIG. 13 indicates energy levels of the qubits A, B, C, and the reservoir (the qubits A, B, C, and the reservoir do not spatially correspond to each other).

As the magnetostatic field is applied to the qubits A, B, C under the effect of the magnet 108, energy difference occurs between $|\uparrow\rangle$ and $|\downarrow\rangle$ owing to Zeeman splitting. As each intensity of the magnetostatic fields applied to the qubits A, B, C is different, a gradient is generated in the energy difference between $|\uparrow\rangle$ and $|\downarrow\rangle$.

When a positive DC voltage is applied to the initialization gate 101, and a negative DC voltage is applied to the qubit control gates 1301, 1302, 1303, electrons existing in the first layer 1201 of the fin 102 move to the joined parts of the third layer 1203 of the fin 102 with the qubit control gates 1301, 1302, 1303 while passing through the second layer 1202 of the fin 102. When the DC voltage applied to the initialization gate 101 is returned to zero upon movement of the single electron, the electron is confined in each joined part of the third layer 1203 of the fin 102 with the qubit control gates 1301, 1302, 1303, respectively so that the electron serves as the qubit 201. All electron spins are brought into the low-energy condition of $|\downarrow\rangle$. As the qubit string is cooled at the extremely low temperature in the dilution refrigerator, thermal energy hardly changes the condition to $|\uparrow\rangle$. By implementing the method, all qubits 201 are prepared in the condition of $|\downarrow\rangle$ so that initialization can be executed.

In the first example, the reservoir is formed below the qubit. Alternatively, the reservoir may be formed beside the qubit. In this case, provision of the initializing gate 101 is not necessary. Feeding electrons in order from an end of the qubit array inward allows initialization of all qubits.

Second Example

A second example describes a method of executing a rotary gate operation of the qubit string in the quantum information processing device.

Figure 14:
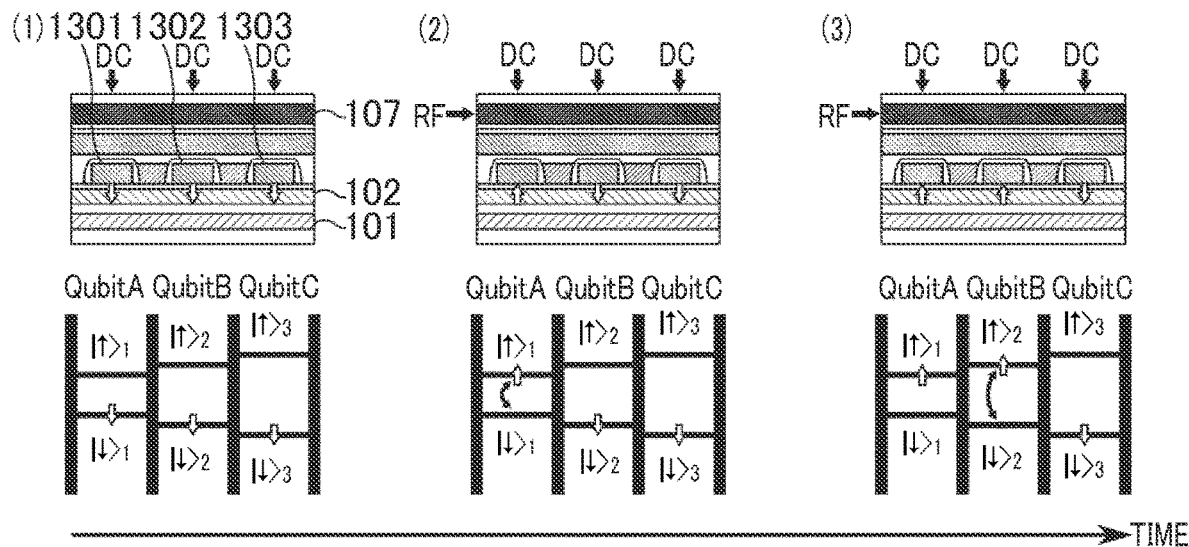
FIG. 14 is a sectional view of the qubit strings for explaining a method of executing a rotary gate operation of the qubit strings that constitute the quantum information processing device, and the electron energy level.

FIG. 14 illustrates three horizontally arranged qubits 201, which are extracted from the qubit string to indicate change in the electron condition upon execution of the rotary gate operation. It is assumed that the qubits 201 generated below the qubit control gates 1301, 1302, 1303 shown in each sectional view of the qubit string in the upper section of FIG. 14 are designated as qubits A, B, and C, respectively. In this case, the qubits A, B are subjected to the rotary gate operation. The lower section of FIG. 14 indicates energy levels of the qubits A, B, C.

Upon application of the RF pulse to the conduction wire 107, the RF pulse is applied to all the horizontally arranged qubits A, B, C. When the energy difference between $|\uparrow\rangle$ and $|\downarrow\rangle$ matches energy difference hv (h: plank's constant) corresponding to a frequency v of the RF pulse, the electron spin starts rotating. This method allows execution of the rotary gate operation.

It is possible to execute the rotary gate operation with arbitrary magnitude by controlling the size and time width of the RF pulse. For example, application of the RF pulse corresponding to the phase π allows execution of a NOT gate operation.

Figure 15:
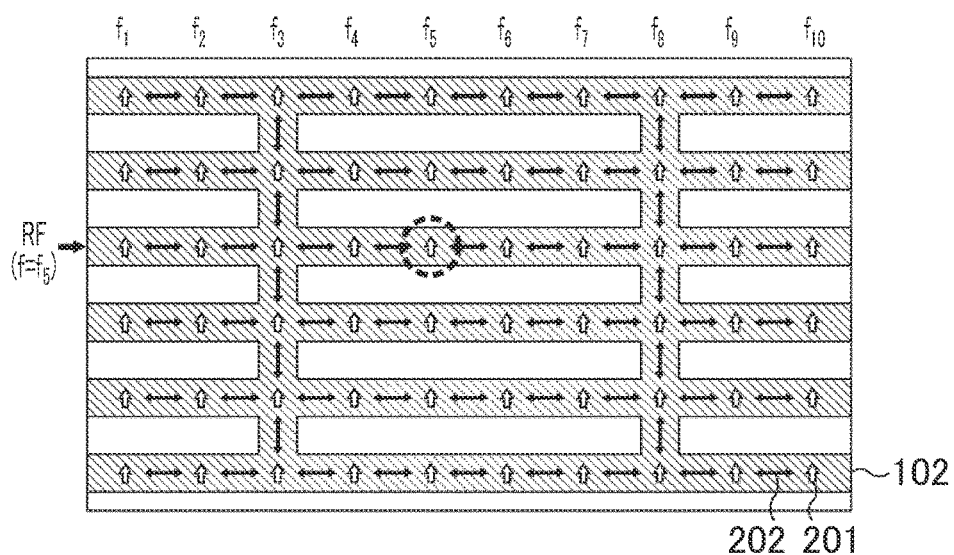
FIG. 15 is a plan view of the qubit strings for explaining individual operability upon execution of the rotary gate operation of the qubit strings that constitute the quantum information processing device.

Individual operability of the rotary gate operation will be described referring to FIG. 15.

As each energy difference between $|\uparrow\rangle$ and $|\downarrow\rangle$ is different among the horizontally arranged qubits 201, the rotary gate operation can be executed to arbitrary one of the qubits 201 in the qubit string. The RF pulse can be selectively applied to the vertically arranged qubits 201 which are physically separated by the conduction wires 107. This makes it possible to operate arbitrary one of the qubits 201 from the qubit string.

In the second example, the magnet 108 (utilizing Zeeman effect) is used to vary the energy difference among the qubits. The energy difference can also be varied by changing the voltage applied to the qubit control gate. This case does not need provision of the magnet 108.

In the second example, the RF pulse is applied through the conduction wire 107. The RF pulse can also be applied through the qubit control gate 103. This case does not need provision of the conduction wire 107.

Third Example

A third example describes a method of executing a control NOT gate operation of the qubit string in the quantum information processing device.

Figure 16:
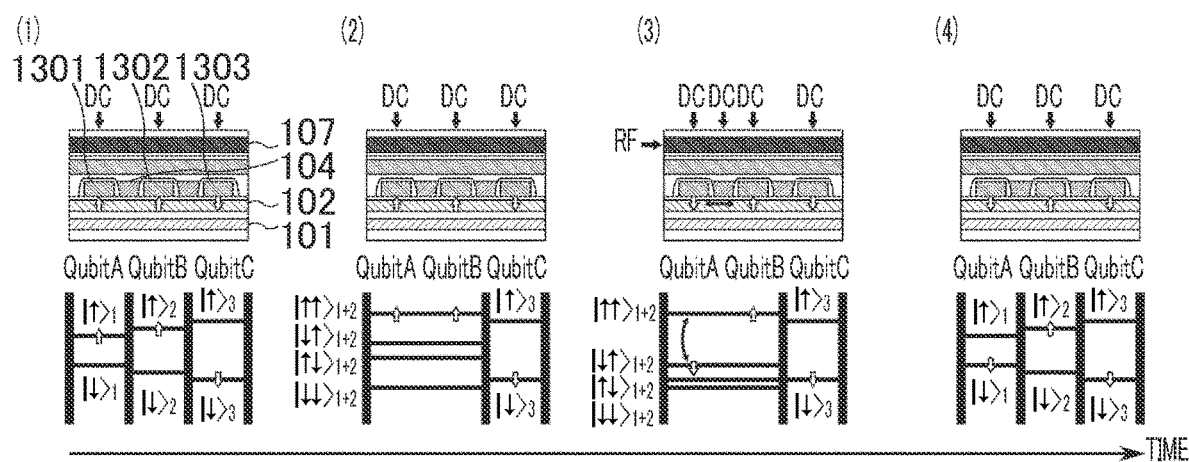
FIG. 16 is a sectional view of the qubit strings for explaining a method of executing a control gate operation of the qubit strings that constitute the quantum information processing device, and the electron energy level.
Figure 17:
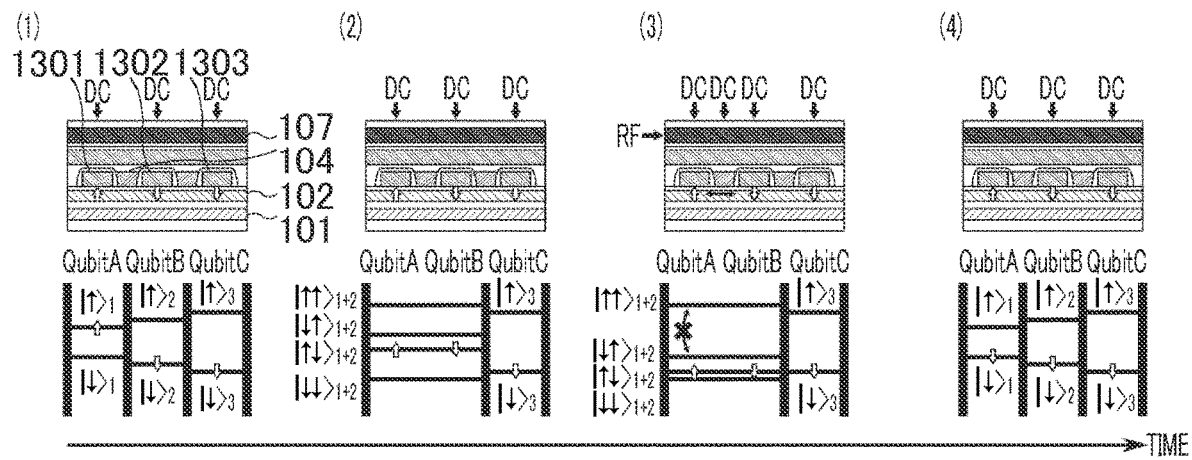
FIG. 17 is a sectional view of the qubit strings for explaining the method of executing the control gate operation of the qubit strings that constitute the quantum information processing device, and the electron energy level.

FIGS. 16 and 17 illustrate three horizontally arranged qubits 201, which are extracted from the qubit string to indicate change in the electron condition upon execution of the control NOT gate operation.

It is assumed that the qubits 201 generated below the qubit control gates 1301, 1302, 1303 shown in each sectional view of the qubit string in the upper sections of FIGS. 16 and 17 are designated as qubits A, B, and C, respectively. In this case, the control NOT gate operation is executed in the condition where the qubit A serves as a target bit, and the qubit B serves as a control bit. Each of lower sections of FIGS. 16 and 17 indicates energy levels of the qubits A, B, C.

FIG. 16 indicates the change in the electron condition upon start of the NOT gate operation with the target bit, which has been caused by the control bit in the state of $|\uparrow\rangle$. Referring to the state (1), the electron energy of the target bit is separated from the electron energy of the control bit. Like the state (2), it is possible to collectively express the electron energy of both the target bit and the control bit. The state (1) is equivalent to the state (2). If both electrons are in the state of $|\uparrow\rangle$, the energy is maximized. If both electrons are in the state of $|\downarrow\rangle$, the energy is minimized. If the electron spin is antiparallel to the other electron spin, the energy takes a middle value. Under the effect of the magnet 108, the energy difference between $|\uparrow\rangle$ and $|\downarrow\rangle$ of the target bit is different from that of the control bit. Accordingly, the energy difference between $|\uparrow\downarrow\rangle$ and $|\downarrow\uparrow\rangle$ occurs as well.

The state (3) indicates the electron condition upon execution of the control NOT gate. In the case where the electron spin is antiparallel to the other electron spin, application of the negative DC voltage to the interaction control gate 104 between the target bit and the control bit stabilizes the electron condition, resulting in lowered energy. It is therefore possible to adjust the energy difference between $|\uparrow\uparrow\rangle$ and $|\uparrow\downarrow\rangle$ to the arbitrary value in accordance with the magnitude of the DC voltage applied to the interaction control gate 104.

The energy difference between $|\eta\eta\rangle$ and $|\downarrow\uparrow\rangle$ is set to the value larger than the energy difference in the condition combined with other electrons, and then the RF pulse at the frequency ν corresponding to the energy difference hν is applied through the conduction wire 107. As a result, the electron spin rotation occurs between $|\uparrow\uparrow\rangle$ and $|\downarrow\uparrow\rangle$. When returning the DC voltage applied to the interaction control gate 104 to zero subsequent to application of the RF pulse corresponding to the phase π, the electron condition becomes the state as indicated by (4) where the NOT gate operation is applied to the target bit.

FIG. 17 indicates the change in the electron condition when the NOT gate operation with the target bit does not occur because of the control bit in the state of $|\downarrow\rangle$. FIG. 17 is different from FIG. 16 in that the initial control bit is in the state of $|\downarrow\rangle$ rather than $|\uparrow\rangle$. There is no difference in the DC voltage nor the RF pulse to be applied. In the cases of (2) and (3), states of $|\uparrow\uparrow\rangle$ and $|\downarrow\uparrow\rangle$ do not exist, and accordingly, no electron spin rotation occurs. The method as described above allows execution of the control NOT gate operation.

Figure 18:
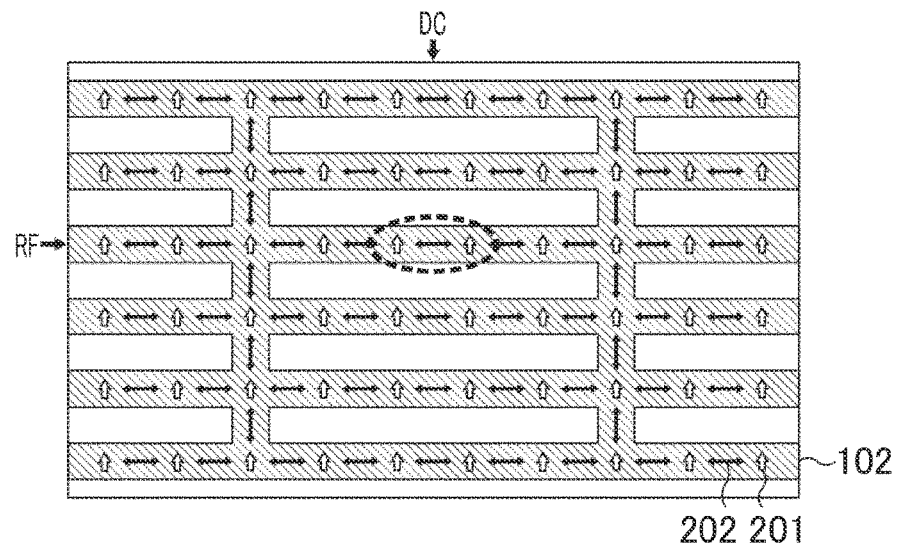
FIG. 18 is a plan view of the qubit strings for explaining individual operability upon execution of a control NOT gate operation of the qubit strings that constitute the quantum information processing device.

An explanation will be made with respect to individual operability of the control NOT gate operation referring to FIGS. 18 and 19. FIG. 18 indicates that the target bits and the control bits are horizontally arranged. The interaction control gates 104 are separated from each other in the horizontal direction, and the conduction wires 107 are separated from each other in the vertical direction. The electron condition is kept unchanged unless the DC voltage and the RF pulse are simultaneously applied. The control NOT gate operation can be executed to two arbitrary adjacent qubits 201 in the qubit string. The magnitude of the DC voltage to be applied to the interaction control gate 104 may be changed to select one of those two qubits 201 as the target bit, and the other as the control bit.

Figure 19:
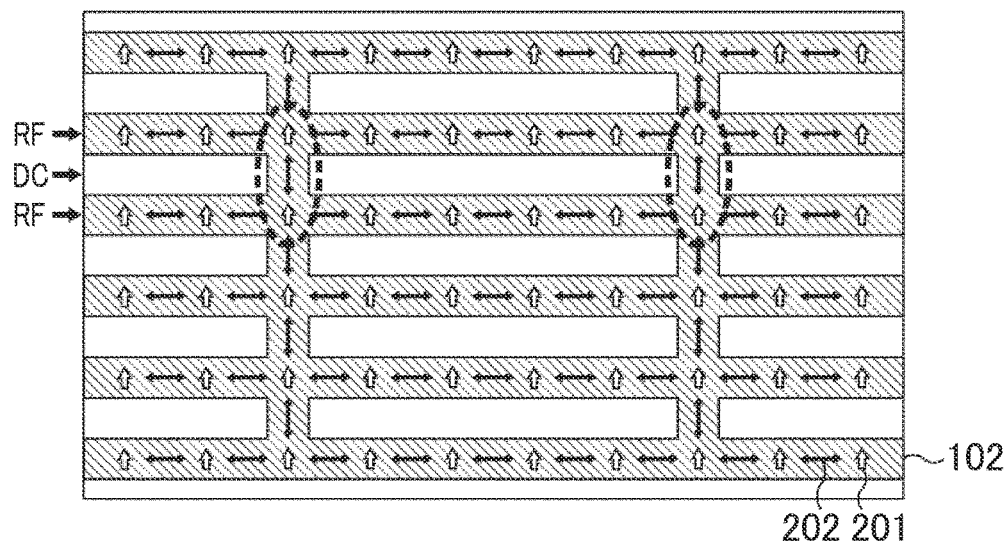
FIG. 19 is a plan view of the qubit strings for explaining individual operability upon execution of the control NOT gate operation of the qubit strings that constitute the quantum information processing device according to the present invention.

FIG. 19 indicates that the target bits and the control bits are vertically arranged. As the interaction control gates 104 and the conduction wires 107 are separated in the vertical direction, the two horizontally arranged qubits 201 are subjected to the control NOT gate operation simultaneously.

Fourth Example

A fourth example describes a method of executing a read-out operation of the qubit string in the quantum information processing device.

Figure 20:
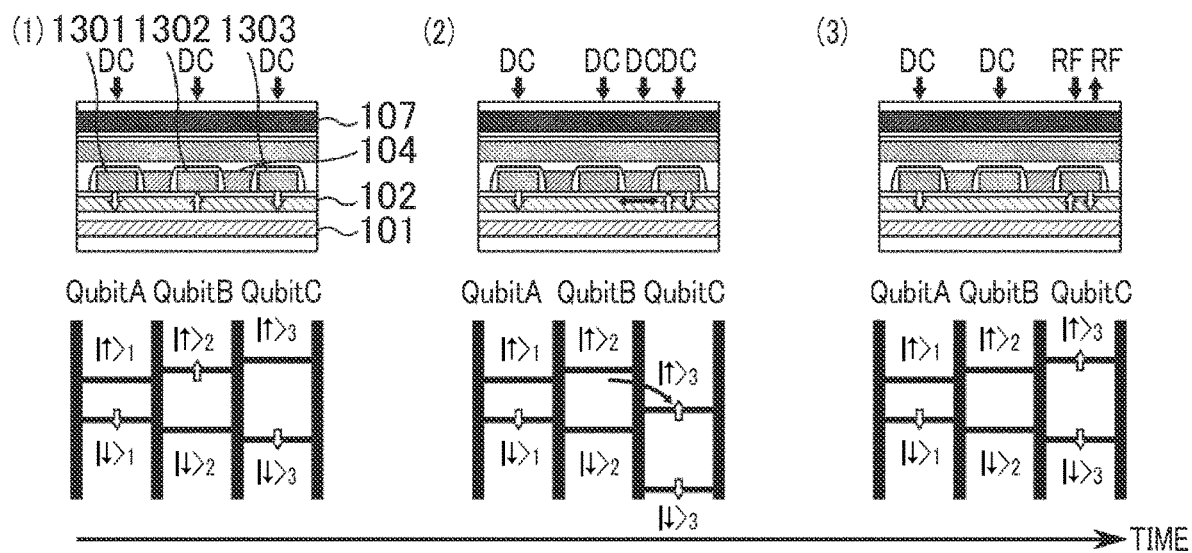
FIG. 20 is a sectional view of the qubit strings for explaining a method of executing a read-out operation of the qubit strings that constitute the quantum information processing device, and the electron energy level.
Figure 21:
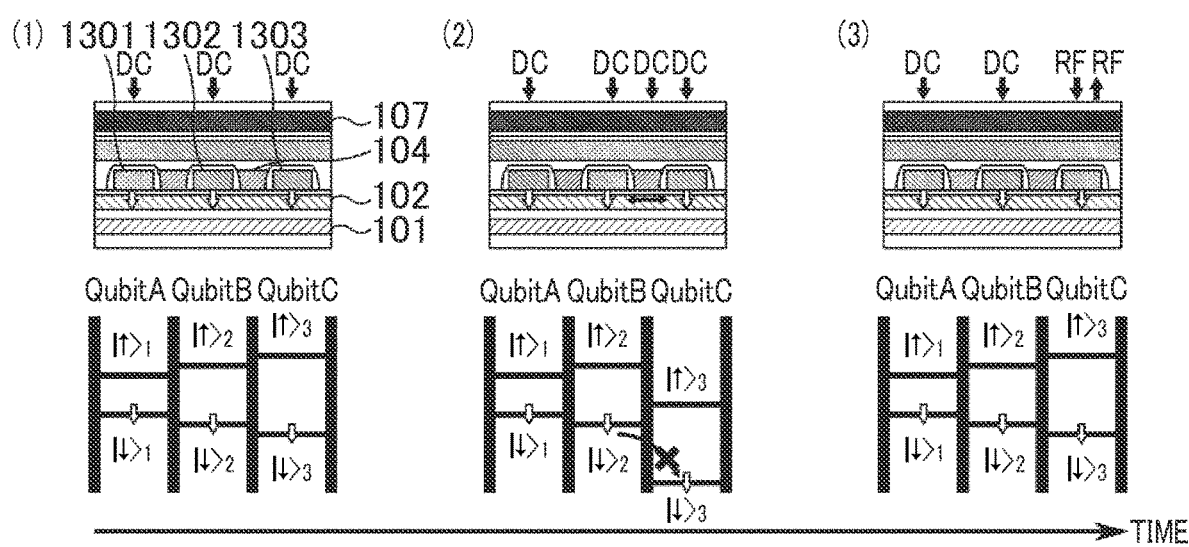
FIG. 21 is a sectional view of the qubit strings for explaining the method of executing the read-out operation of the qubit strings that constitute the quantum information processing device according to the present invention, and the electron energy level.

FIGS. 20 and 21 illustrate three horizontally arranged qubits 201, which are extracted from the qubit string to indicate change in the electron condition upon execution of the read-out operation. It is assumed that the qubits 201 generated below the qubit control gates 1301, 1302, 1303 shown in each sectional view of the qubit strings in the upper sections of FIGS. 20 and 21 are designated as qubits A, B, and C. The qubit C serves as a read-out control bit, and the qubit B serves as the qubit to be measured so that the read-out operation is executed.

FIG. 20 indicates the change in the electron condition when the qubit B to be measured is in the state of $|\uparrow\rangle$. As the state (2) illustrates, the negative DC voltage is applied to the interaction control gate 104 between the qubits B and C to lower the energy barrier between the two qubits. The negative DC voltage to be applied to the qubit control gate 1303 is further intensified to facilitate electron movement from the qubit B to C. As the electron condition of the qubit B is in the state of $|\uparrow\rangle$, and the electron condition of the qubit C is in the state of $|\downarrow\rangle$, electrons move without causing Pauli spin blockade. Thereafter, when the DC voltage to be applied to the interaction control gate 104 is returned to zero, two electrons are confined in the qubit C.

FIG. 21 indicates the change in the electron condition when the qubit B to be measured is in the state of $|\downarrow\rangle$. Execution of the operation similar to the one as illustrated in FIG. 20 may facilitate the electron movement from the qubit B to C. As the electron spins of the qubits B and C are in the state of $|\downarrow\rangle$, no electron movement occurs owing to Pauli spin blockade. Thereafter, when the DC voltage to be applied to the interaction control gate 104 is returned to zero, one electron is confined in the qubit C.

In either case as illustrated in FIG. 20 or 21, the RF pulse is applied to the qubit control gate 103 in the end. As the impedance varies depending on the number of electrons either 1 or 2, the number of electrons in the qubit C is estimated by confirming the phase of the RF pulse to be reflected. It is therefore possible to indirectly measure the electron spin condition of the qubit B. The method as descried above allows execution of the read-out operation.

As each of all the qubits 201 has the same structure, an arbitrary qubit can be read from the qubit string. Each of the qubit control gates 103, 105 is linearly shaped extending in the vertical or horizontal direction. The read-out operations can be simultaneously executed to all the qubits 201 arranged along the qubit control gate 103 or 105.

The present invention is not limited to the foregoing examples, but includes various modifications. For example, the positional relation between the first qubit control gate and the second qubit control gate may be defined by an arbitrary angle without being at right angles. In such a case, the resultant structure has a triangular lattice or a hexagonal lattice rather than the two-dimensional square lattice. Each of the qubit control gates and the interaction control gates may be 2-layered, or 3- or more layered. In such a case, interaction between the qubits may occur not only in the horizontal and vertical directions, but also in an arbitrary angular direction.

LIST OF REFERENCE SIGNS

101 initialization gate,
102 fin,
103 qubit control gate,
104 interaction control gate,
105 qubit control gate,
106 interaction control gate,
107 conduction wire,
108 magnet,
201 qubit,
202 interaction,
203 switch,
401 semiconductor crystal substrate,
402 insulator layer,
403 gate insulating film,
501 spacer,
601 insulator layer,
801 spacer,
901 insulator layer,
1001 insulator layer,
1201 n-type semiconductor layer,
1202 insulator layer,
1203 semiconductor layer,
1301 qubit control gate,
1302 qubit control gate,
1303 qubit control gate

The invention claimed is:

1. A quantum information processing device, comprising:
a fin;
a first layer formed on the fin; and
a second layer formed on the first layer, wherein:
the fin includes a qubit string having multiple qubits arranged in a row in a first direction, and an interaction string having multiple inter-qubit interactions arranged in a row in the first direction;
the qubit string and the interaction string are alternately arranged in a second direction that is different from the first direction;
the first layer includes a first gate electrode array disposed in the first direction to control the qubits of the qubit string, and a second gate electrode array disposed in the first direction to control the inter-qubit interaction of the interaction string;
the second layer includes a third gate electrode array disposed in the second direction, and a fourth gate electrode array disposed in the second direction adjacently to the third gate electrode array; and
the third and the fourth gate electrode arrays control a part of the multiple qubits, and a part of the multiple inter-qubit interactions, respectively.

2. The quantum information processing device according to claim 1, wherein:
the second layer has a part of the third gate electrode arrays and a part of the fourth gate electrode arrays each extending as an electrode array in the first direction; and
the electrode array controls the part of the qubits and the part of the inter-qubit interactions, respectively.

3. The quantum information processing device according to claim 2, wherein the electrode arrays are discretely disposed in the second direction to two-dimensionally extend the number of qubits.

4. The quantum information processing device according to claim 2, wherein:
the electrode array forms a protruding portion; and
the protruding portion is in contact with the fin.

5. The quantum information processing device according to claim 4, wherein the protruding portion is in contact with the fin at a part where the first and the second gate electrode arrays of the first layer are not formed.

6. The quantum information processing device according to claim 1, further comprising conduction wire arrays provided on the second layer in the second direction for applying a high frequency signal to the qubit.

7. The quantum information processing device according to claim 6, further comprising magnet arrays provided on the conduction wire arrays in the second direction for applying a magnetostatic field to the qubit.

8. The quantum information processing device according to claim 1, further comprising an initialization gate electrode provided below the fin for initializing the qubit.

9. The quantum information processing device according to claim 1, wherein the first direction and the second direction are orthogonal to each other.

10. The quantum information processing device according to claim 9, wherein the first direction is a vertical direction, and the second direction is a horizontal direction.

* * * * *